United States Patent
Ohkubo et al.

(10) Patent No.: US 9,779,994 B2
(45) Date of Patent: Oct. 3, 2017

(54) WAFER PROCESSING METHOD

(71) Applicant: DISCO CORPORATION, Tokyo (JP)

(72) Inventors: Hironari Ohkubo, Tokyo (JP); Taku Iwamoto, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/388,062

(22) Filed: Dec. 22, 2016

(65) Prior Publication Data

US 2017/0186646 A1    Jun. 29, 2017

(30) Foreign Application Priority Data

Dec. 24, 2015   (JP) .................................. 2015-251359

(51) Int. Cl.
| | |
|---|---|
| *H01L 21/78* | (2006.01) |
| *H01L 21/304* | (2006.01) |
| *H01L 21/66* | (2006.01) |
| *H01L 23/544* | (2006.01) |

(52) U.S. Cl.
CPC .......... *H01L 21/78* (2013.01); *H01L 21/3043* (2013.01); *H01L 22/12* (2013.01); *H01L 23/544* (2013.01); *H01L 2223/54426* (2013.01); *H01L 2223/54453* (2013.01)

(58) Field of Classification Search
CPC ...................... H01L 21/78–21/86; H01L 22/12
See application file for complete search history.

(56) References Cited

U.S. PATENT DOCUMENTS

2016/0027696 A1*  1/2016  Nagaoka ............. H01L 21/6835
438/14

FOREIGN PATENT DOCUMENTS

JP        2012-151225        8/2012

* cited by examiner

*Primary Examiner* — Daniel Shook
(74) *Attorney, Agent, or Firm* — Greer Burns & Crain, Ltd.

(57) ABSTRACT

A wafer processing method including the steps of storing information on the intervals and positions of metal patterns formed on part of division lines on a wafer into a storage unit of a cutting apparatus, detecting the division lines, forming a cut groove along each division line by using a cutting blade, imaging an area including the cut groove at any position where the metal patterns are not formed, by using an imaging unit included in the cutting apparatus, according to the information on the intervals and positions of the metal patterns previously stored, during the step of forming the cut grooves, and measuring the positional relation between the position of the cut groove and a preset cutting position. Accordingly, kerf check can be performed without being influenced by burrs produced from the metal patterns in cutting the wafer, so that the wafer can be cut with high accuracy.

1 Claim, 6 Drawing Sheets

WAFER PROCESSING METHOD

BACKGROUND OF THE INVENTION

Field of the Invention

The present invention relates to a wafer processing method for processing a semiconductor wafer having metal patterns formed on part of division lines at given intervals.

Description of the Related Art

In a semiconductor device fabrication process, a plurality of electronic circuits such as integrated circuits (ICs) and large-scale integrations (LSIs) are formed on the front side of a substantially disk-shaped workpiece such as a semiconductor wafer. The back side of the workpiece thus having the plural electronic circuits is ground to reduce the thickness of the workpiece to a predetermined thickness. Thereafter, a device area of the workpiece where the electronic circuits are formed is cut along division lines called streets by using a cutting blade to thereby divide the workpiece into a plurality of device chips. A cut groove formed along each division line on the front side of the workpiece is periodically imaged by using imaging means, and a deviation between a reference line set in the imaging means and the cut groove or a preset cutting position on the workpiece is measured. Then, the cutting position is corrected according to this deviation (see Japanese Patent Laid-Open No. 2012-151225, for example).

SUMMARY OF THE INVENTION

In the case that metal patterns called test element group (TEG) are formed at given intervals on the streets formed on the front side of the workpiece, burrs may be produced from the metal patterns along the cut groove formed by cutting the workpiece. Accordingly, when the area where the metal patterns have been cut is imaged and measured, there is a possibility that the burrs may be erroneously recognized as the cut groove.

It is therefore an object of the present invention to provide a wafer processing method which can detect the cut groove without being influenced by the metal patterns formed on a wafer and can cut the wafer with high accuracy.

In accordance with an aspect of the present invention, there is provided a wafer processing method for processing a wafer by using a cutting apparatus including cutting means having a cutting blade, the wafer including a substrate and a plurality of devices formed on the front side of the substrate in a plurality of separate regions defined by a plurality of crossing division lines, the wafer further including a plurality of metal patterns for testing arranged on part of the division lines at given intervals, the wafer processing method including a metal pattern position storing step of storing information on the intervals and positions of the metal patterns into storage means included in the cutting apparatus; an alignment step of detecting the division lines of the wafer by using alignment means included in the cutting apparatus after performing the metal pattern position storing step; a cut groove forming step of forming a cut groove along each division line by using the cutting blade of the cutting means after performing the alignment step; and a cut position measuring step of imaging an area including the cut groove at any position where the metal patterns are not formed, by using imaging means included in the cutting apparatus, according to the information on the intervals and positions of the metal patterns previously stored in the metal pattern position storing step, during performing the cut groove forming step, and next measuring the positional relation between the position of the cut groove and a preset cutting position.

The wafer processing method of the present invention includes the cut position measuring step of imaging an area including the cut groove at any position where the metal patterns are not formed according to the information on the intervals and positions of the metal patterns previously stored in the metal pattern position storing step, during performing the cut groove forming step, and next measuring the positional relation between the position of the cut groove and a preset cutting position. Accordingly, kerf check can be performed without being influenced by burrs produced from the metal patterns in cutting the wafer, so that the wafer can be cut with high accuracy.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
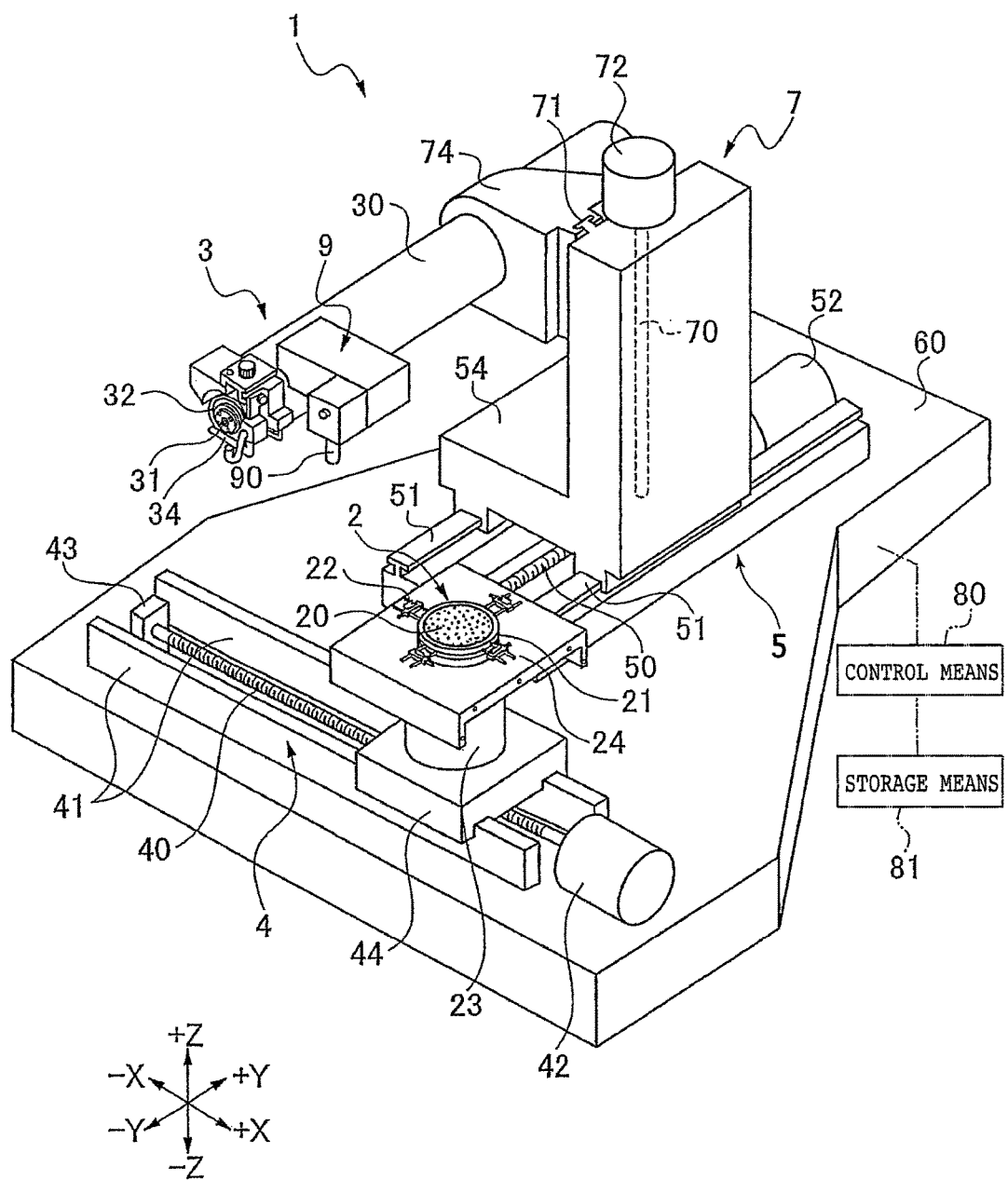
FIG. 1 is a perspective view of a cutting apparatus for use in performing a preferred embodiment of the present invention.

Referring to FIG. 1, there is illustrated a cutting apparatus 1 for use in performing a preferred embodiment of the present invention. The cutting apparatus 1 is an apparatus for cutting a wafer held on a chuck table 2 by using cutting means 3. The chuck table 2 is movable in the X direction (+X or −X direction) by operating X moving means 4. The cutting means 3 is movable in the Y direction (+Y or −Y direction) by operating Y moving means 5 and also movable in the Z direction (+Z or −Z direction) by operating Z moving means 7.

The chuck table 2 includes a suction holding portion 20 for holding the wafer under suction, a frame 21 for supporting the suction holding portion 20 so as to surround the same, and a clamp portion 22 fixed to the outer circumference of the frame 21. The lower portion of the chuck table 2 is connected to a rotational drive portion 23 for rotating the chuck table 2. The rotational drive portion 23 is provided with an upper cover 24.

The X moving means 4 is provided on a stationary base 60. The X moving means 4 includes a ball screw 40 extending in the X direction, a pair of guide rails 41 parallel to the ball screw 40, a motor 42 connected to one end of the ball screw 40 for rotating the ball screw 40, a bearing portion 43 for supporting the other end of the ball screw 40, and a moving base 44 having an internal nut (not illustrated) threadedly engaged with the ball screw 40 and having a lower portion slidably engaged with the guide rails 41. Accordingly, when the ball screw 40 is rotated normally or reversely by operating the motor 42, the moving base 44 is moved in the +X direction or −X direction as being guided by the guide rails 41. The motor 42 is controlled by control means 80 including a central processing unit (CPU), memory, etc. In the case that a pulse motor is used as the motor 42, the number of drive pulses output from the control means 80 to the pulse motor is counted to thereby recognize the position of the chuck table 2 in the X direction. In the case that a servo motor is used as the motor 42, a pulse signal output from a rotary encoder for detecting the rotational speed of the servo motor is transmitted to the control means 80 and the number of pulses output from the rotary encoder is counted by the control means 80 to thereby detect the position of the chuck table 2 in the X direction.

The Y moving means 5 is also provided on the stationary base 60. The Y moving means 5 includes a ball screw 50 extending in the Y direction, a pair of guide rails 51 parallel to the ball screw 50, a motor 52 connected to one end of the ball screw 50 for rotating the ball screw 50, and a moving base 54 having an internal nut (not illustrated) threadedly engaged with the ball screw 50 and having a lower portion slidably engaged with the guide rails 51. Accordingly, when the ball screw 50 is rotated normally or reversely by operating the motor 52, the moving base 54 is moved in the +Y direction or −Y direction as being guided by the guide rails 51. The motor 52 is controlled by the control means 80. In the case that a pulse motor is used as the motor 52, the number of drive pulses output from the control means 80 to the pulse motor is counted to thereby recognize the position of the cutting means 3 in the Y direction. In the case that a servo motor is used as the motor 52, a pulse signal output from a rotary encoder for detecting the rotational speed of the servo motor is transmitted to the control means 80 and the number of pulses output from the rotary encoder is counted by the control means 80 to thereby detect the position of the cutting means 3 in the Y direction.

The Z moving means 7 is provided on the moving base 54. The Z moving means 7 includes a ball screw 70 extending in the Z direction, a pair of guide rails 71 parallel to the ball screw 70, a motor 72 connected to one end of the ball screw 70 for rotating the ball screw 70, and a support portion 74 having an internal nut (not illustrated) threadedly engaged with the ball screw 70 and having a side portion slidably engaged with the guide rails 71. Accordingly, when the ball screw 70 is rotated normally or reversely by operating the motor 72, the support portion 74 is moved in the +Z direction or −Z direction as being guided by the guide rails 71. The motor 72 is controlled by the control means 80. In the case that a pulse motor is used as the motor 72, the number of drive pulses output from the control means 80 to the pulse motor is counted to thereby recognize the position of the cutting means 3 in the Z direction. In the case that a servo motor is used as the motor 72, a pulse signal output from a rotary encoder for detecting the rotational speed of the servo motor is transmitted to the control means 80 and the number of pulses output from the rotary encoder is counted by the control means 80 to thereby detect the position of the cutting means 3 in the Z direction.

The cutting means 3 includes a housing 30, a spindle 31 rotatably supported to the housing 30, and a cutting blade 32 mounted on the spindle 31 at its front end. The housing 30 is supported to the support portion 74. The cutting means 3 further includes a pair of cutting fluid nozzles 34 (one of which being illustrated) so provided as to interpose the cutting blade 32 therebetween in the Y direction.

Alignment means 9 is fixed to the housing 30 at its side portion. The alignment means 9 includes imaging means 90 for imaging the wafer. According to an image obtained by the imaging means 90, the alignment means 9 can detect a cutting position on the wafer. The alignment means 9 is movable with the cutting means 3 in the Y direction and the Z direction. The control means 80 is connected to storage means 81 having a storage element such as a memory. The control means 80 functions to control each component of the cutting apparatus 1 according to information stored in the storage means 81.

Figure 2:
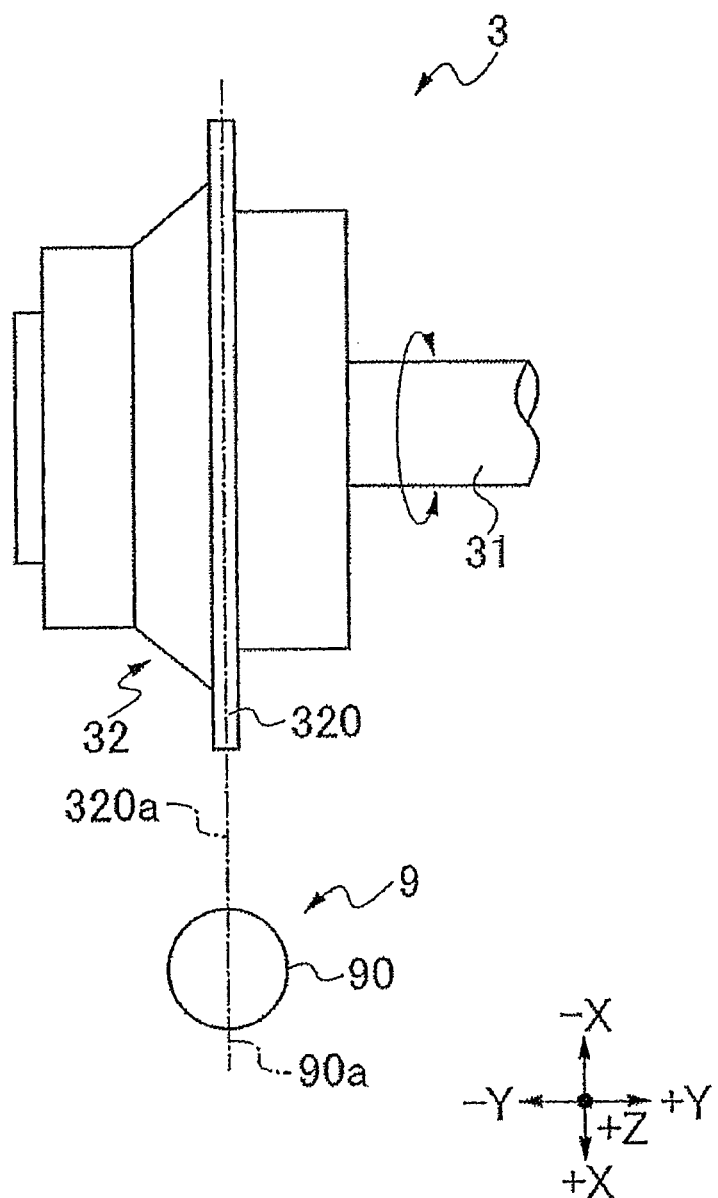
FIG. 2 is a plan view illustrating the positional relation between a cutting blade and imaging means.

As illustrated in FIG. 2, the center line 320a of a cutting edge 320 constituting the cutting blade 32 in the thickness direction of the cutting edge 320 (in the Y direction) is previously adjusted so as to coincide with the extension of an alignment reference line 90a formed at the center of a lens included in the imaging means 90.

There will now be described a method of forming a cut groove on the front side W1 of a wafer W illustrated in FIG. 3A and checking whether or not the cut groove is formed at a predetermined position, by using the cutting apparatus 1 mentioned above.

Figure 3A:
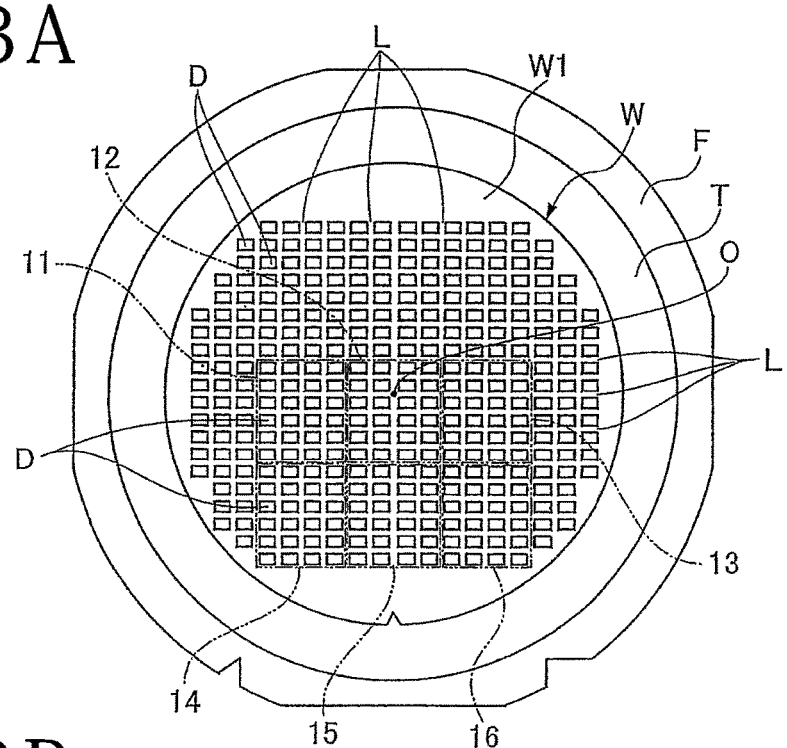
FIG. 3A is a plan view of a wafer as a workpiece.

As illustrated in FIG. 3A, a plurality of crossing division lines (which will be hereinafter referred to as "lines") L are formed on the front side W1 of the wafer W to define a plurality of separate regions where a plurality of devices D are formed. The back side of the wafer W is attached to a tape T. A ring frame F is attached to the peripheral portion of the tape T. Accordingly, the wafer W is supported through the tape T to the frame F. The wafer W is held under suction through the tape T on the suction holding portion 20 of the chuck table 2 illustrated in FIG. 1, and the frame F is fixed by the clamp portion 22.

Each device D constituting the wafer W is formed on the front side of a substrate such as a silicon substrate in a semiconductor device fabrication process. A circuit pattern in each device D is formed by projection exposure through a reticle in a stepper. The reticle has a circuit pattern corresponding to that in each device D. In fabricating one wafer W, a plurality of reticles are used.

Figure 3B:
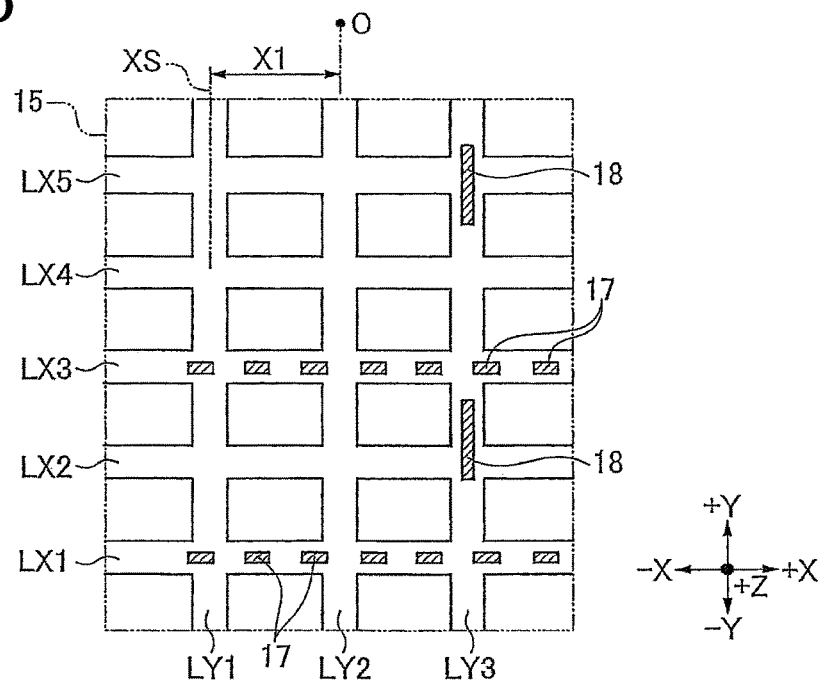
FIG. 3B is an enlarged plan view of an essential part of the wafer illustrated in FIG. 3A.

The wafer W is composed of a plurality of areas divided according to the reticles to be used. For example, the wafer W illustrated in FIG. 3A includes areas 11 to 16. As illustrated in FIG. 3B, each of the areas 11 to 16 includes lines LX1 to LX5 extending in the X direction and lines LY1 to LY3 extending in the Y direction. The number of lines L extending in the X direction and the number of lines L extending in the Y direction are previously determined according to each reticle.

(1) Metal Pattern Position Storing Step

As illustrated in FIG. 3B, metal patterns 17 called TEG are formed on the lines LX1 and LX3 in each of the areas 11 to 16. Further, metal patterns 18 are formed on the line LY3 in each of the areas 11 to 16. These metal patterns 17 and 18 are formed of copper, for example. The metal patterns 17 are formed on each of the lines LX1 and LX3 at given intervals. Similarly, the metal patterns 18 are formed on the line LY3 at a given interval. Accordingly, the metal patterns 17 and 18 are formed at the same positions in all of the areas 11 to 16. While the metal patterns 17 and 18 are formed on the lines LX1 and LX3 and the line LY3, respectively, in FIG. 3B, such metal patterns may be formed on any other lines. The metal patterns 17 and 18 function as test elements for use in finding out any design or production problems that may occur in each device D. The metal patterns 17 and 18 are also formed through a reticle by sputter, chemical vapor deposition (CVD), etc. Accordingly, this reticle is formed with a mask corresponding to the metal patterns 17 and 18.

As the specifications of each reticle, various items of information are previously determined as including the number of lines L extending in the X direction, the number of lines L extending in the Y direction, the lines where the metal patterns are formed, the intervals of the metal patterns, and the positions of the metal patterns. These items of information are input by an operator through any inputting means (e.g., keyboard or touch panel) included in the cutting apparatus 1. The information thus input is stored into the storage means 81 illustrated in FIG. 1.

The operator also inputs into the storage means 81 such information as which line in the reticle corresponds to the outermost line on the wafer W. For example, since the line LX1 in the area 15 illustrated in FIG. 3B is the outermost line on the wafer W, the information that the line LX1 in the reticle corresponds to the outermost line.

Figure 4:
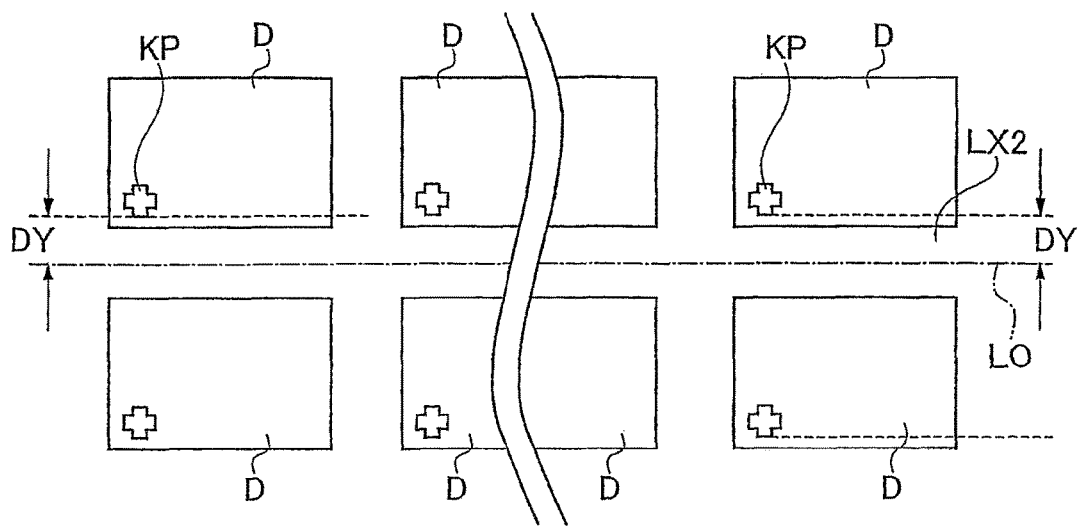
FIG. 4 is an enlarged plan view illustrating the positional relation between key patterns in devices and a division line.

Further, the operator specifies a key pattern to be used in performing pattern matching for detecting a target line in an alignment step to be hereinafter described, and then stores an image including this key pattern into the storage means 81. For example, a specific circuit pattern having a characteristic shape in each device D, e.g., a key pattern KP illustrated in FIG. 4, is previously selected as the key pattern for the pattern matching. In this case, an image including this key pattern KP is stored into the storage means 81. Further, the storage means 81 also stores a distance DY from the key pattern KP to the center LO of the adjacent line extending in the X direction (e.g., the line LX2) as illustrated in FIG. 4. Further, as the key pattern, any part provided outside each device D of the wafer W for the pattern matching may be used in place of the circuit pattern formed in each device D.

Further, the operator also stores into the storage means 81 a kerf check position XS in the X direction to be used in performing kerf check for a cut groove formed by a cutting operation. The kerf check position XS is a position displaced from the center O of the wafer W by an amount X1 in the X direction. The operator operates the imaging means 90 illustrated in FIG. 1 to thereby image the wafer W. As seeing an image of the wafer W displayed on a monitor (not illustrated), the operator selects any position where the metal patterns 17 and 18 are not formed and then decides the value of X1.

In addition, the storage means 81 further stores any information including the size (diameter) of the wafer W and an index size (the distance from the center of a certain line to the center of its adjacent line), which is the distance between any adjacent lines L.

(2) Alignment Step (2a) Adjustment of the Orientation of the Wafer W

The wafer W held on the chuck table 2 is positioned below the imaging means 90 by moving the chuck table 2 in the −X direction from the position illustrated in FIG. 1. In this condition, two key patterns KP illustrated in FIG. 4, e.g., two key patterns KP formed in the two devices D located at the opposite ends in the X direction along the line LX2, are detected by pattern matching.

The control means 80 performs the pattern matching for the two key patterns KP adjacent to the specific line LX2 to detect the two key patterns KP and determine the Y coordinates of the two key patterns KP detected. When the Y coordinates of the two key patterns KP are equal to each other, the control means 80 determines that the line LX2 extends parallel to the X direction. When the Y coordinates of the two key patterns KP are not equal to each other, the control means 80 calculates an angle formed between the X axis and the line connecting the two key patterns KP and then operates the rotational drive portion 23 illustrated in FIG. 1 to rotate the chuck table 2 by this angle, thereby making the line LX2 parallel to the X direction. Further, the control means 80 recognizes the Y coordinate of the center LO of the line LX2.

(2b) Calculation of the Center Position of the Wafer

Figure 5:
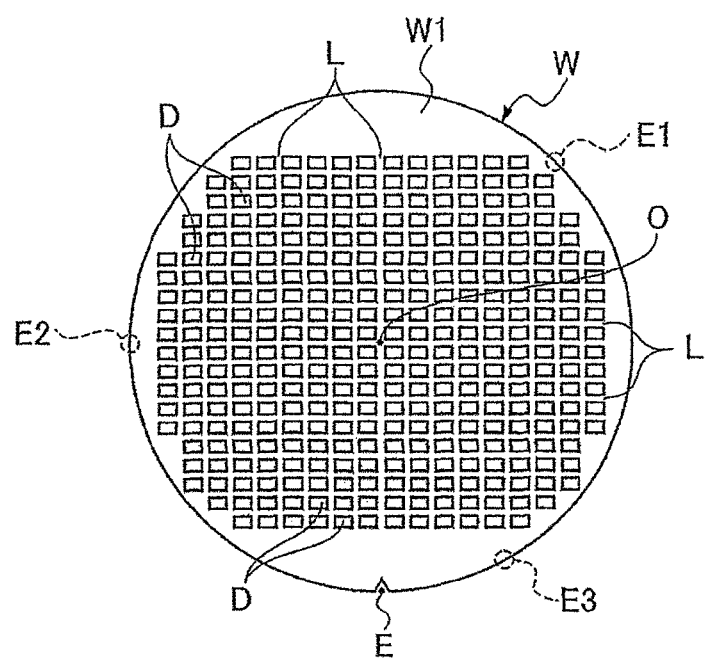
FIG. 5 is a plan view illustrating the center and edge of the wafer.

Thereafter, the chuck table 2 is rotated to image a plurality of peripheral areas of the wafer W, e.g., three peripheral areas E1, E2, and E3 illustrated in FIG. 5, thereby obtaining images of these peripheral areas E1 to E3 and detecting the edge of the wafer W. That is, the control means 80 determines the X-Y coordinates of the three points on the edge of the wafer W. More specifically, image processing is performed in such a manner that in the images of the peripheral areas E1, E2, and E3 a portion where the pixel value has changed in an amount not less than a given threshold is recognized as the edge, thereby obtaining the X-Y coordinates of the three points. The control means 80 determines the X-Y coordinates of the center O of the wafer W according to the X-Y coordinates of the three points.

(2c) Calculation of the Position of the Outermost Line

Thereafter, the control means 80 determines that the position spaced apart from the center O to the outer circumference of the wafer W by its radius coincides with the edge E of the wafer W, according to the size (diameter) of the wafer W previously stored in the storage means 81. The control means 80 then calculates the Y coordinate of the edge E. Thereafter, the control means 80 determines the Y coordinate of the outermost line to be first cut, according to the Y coordinate of the edge E, the index size of the wafer W stored in the storage means 81, and the number of lines L extending in the X direction stored in the storage means 81. The Y coordinate of the outermost line is stored into the storage means 81. This outermost line is the line LX1 in each of the areas 14, 15, and 16. By determining the outermost line LX1 on the basis of the center O of the wafer W, the following advantage can be obtained. That is, even if the center of the chuck table 2 does not coincide with the center of the wafer W in transferring the wafer W to the chuck table 2, the position of the outermost line LX1 can be accurately obtained.

As a modification, a special target pattern for detection of the outermost line may be previously formed in any area of the wafer W other than the devices D, and the position of the outermost line may be obtained according to the positional relation between the target pattern and the outermost line. Also in this case, even if the center of the chuck table 2 does not coincide with the center of the wafer W, the position of the outermost line LX1 can be accurately obtained.

(3) Cut Groove Forming Step

As described above, the information required for cutting and check of a cut groove to be formed by cutting is stored into the storage means 81, and the alignment step is performed. Thereafter, cutting is actually performed along each line to form a cut groove, and it is then checked whether or not the cut groove has been formed at a desired position (kerf check). The control means 80 reads from the storage means 81 the information on the lines where the metal patterns 17 and 18 are formed, and then decides the line where the metal patterns are not formed, as a target of the kerf check. In the example illustrated in FIG. 3B, the line LX4 is decided as a target of the kerf check.

Figure 6A:
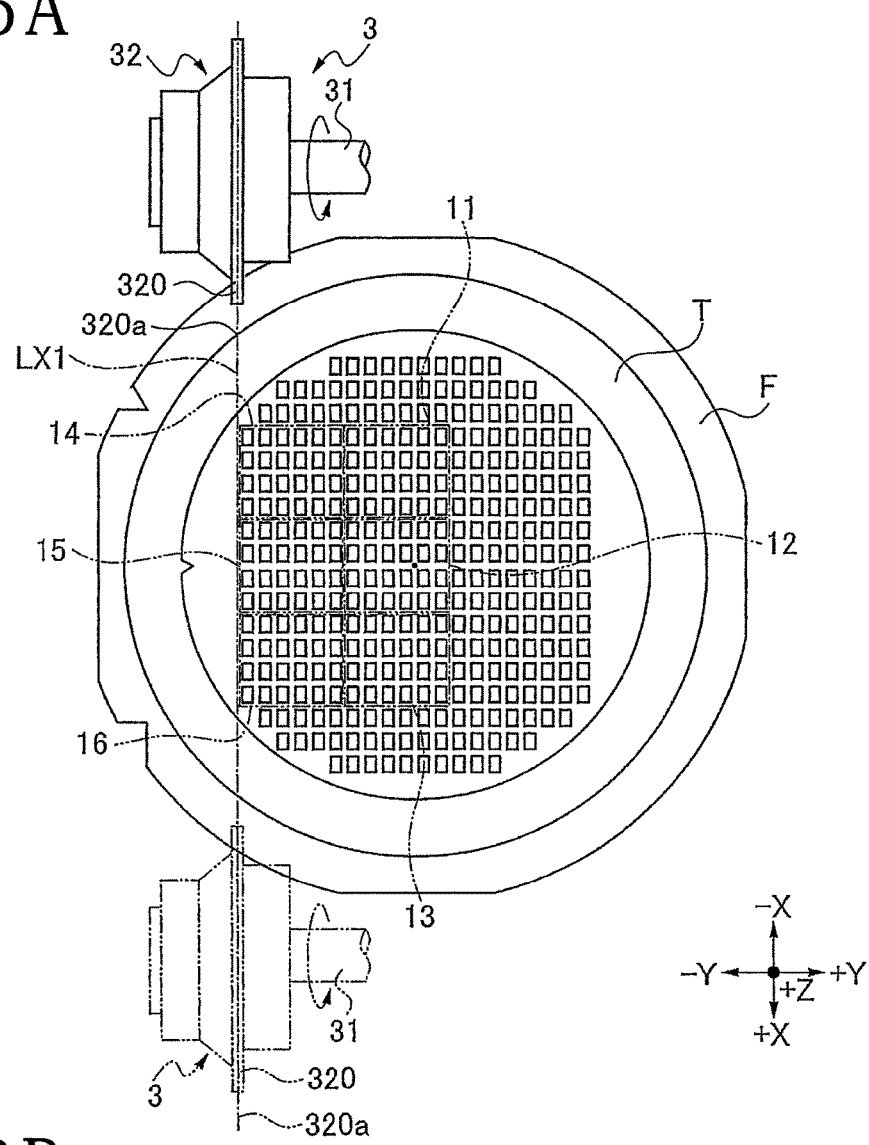
FIG. 6A is a plan view illustrating a step of cutting the wafer along each division line.
Figure 6B:
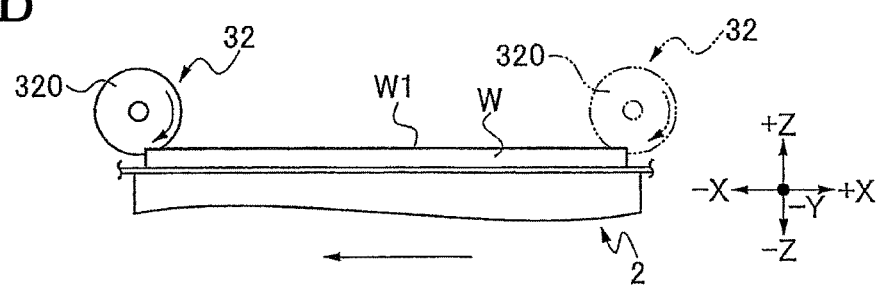
FIG. 6B is an elevational view illustrating the cutting step illustrated in FIG. 6A.
Figure 7:
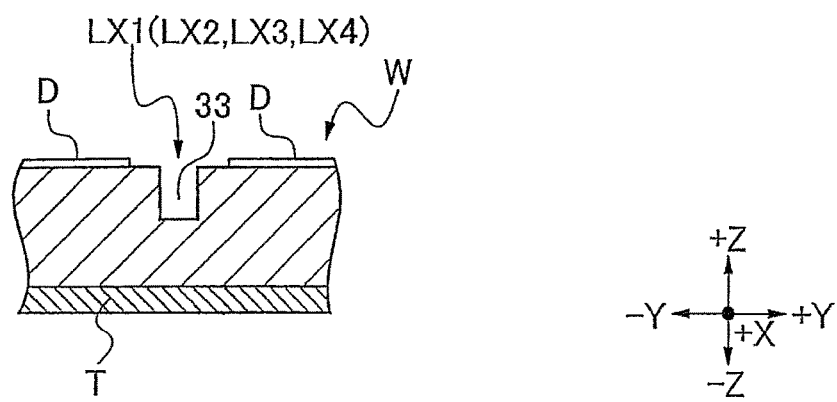
FIG. 7 is a sectional view illustrating a cut groove formed on the wafer along each division line.

Thereafter, the control means 80 operates the motor 52 of the Y moving means 5 illustrated in FIG. 1 to thereby move the cutting means 3 in the Y direction so that the Y position of the cutting edge 320 of the cutting blade 32 coincides with the Y position of the line LX1 as the outermost line detected in the alignment step as illustrated in FIG. 6A. Thereafter, the control means 80 operates the motor 72 of the Z moving means 7 to lower the cutting means 3 in the −Z direction until the cutting edge 320 of the cutting blade 32 being rotated comes to cut into the line LX1 as illustrated in FIG. 6B. Thereafter, the chuck table 2 is fed in the −X direction as illustrated in FIG. 6B. Accordingly, the front side W1 of the wafer W is cut along the line LX1 by the cutting blade 32 to form a cut groove 33 along the line LX1 as illustrated in FIG. 7. During the cutting operation, a cutting fluid is supplied from the cutting fluid nozzles 34 to the cutting blade 32. The cut groove 33 has a predetermined depth not reaching the back side of the wafer W. This predetermined depth is adjusted so that the motor 72 of the Z moving means 7 is controlled by the control means 80.

As illustrated in FIG. 3B, the metal patterns 17 are formed on the line LX1. Accordingly, there is a possibility that burrs may be produced from the metal patterns 17 in forming the cut groove 33 along the line LX1. As a result, if the cut groove 33 formed along the line LX1 is imaged to perform the kerf check, there is a possibility that the burrs may be erroneously recognized as the cut groove 33. Accordingly, the kerf check is not performed for the line LX1, but the next line LX2 is subjected to cutting.

That is, the chuck table 2 is next moved in the +X direction to the original position and the Y moving means 5 illustrated in FIG. 1 is operated to move the cutting means 3 in the +Y direction by the index size stored in the storage means 81, so that the Y position of the cutting blade 32 coincides with the Y position of the line LX2. In this condition, the front side W1 of the wafer W is cut along the line LX2 by the cutting blade 32 in a similar manner to form a cut groove 33 along the line LX2. As illustrated in FIG. 3B, the metal pattern 18 formed on the line LY3 is present at the intersection between the line LY3 and the line LX2. Accordingly, the kerf check is not performed for the line LX2, but the next line LX3 is subjected to cutting.

That is, the chuck table 2 is next moved in the +X direction to the original position and the Y moving means 5 illustrated in FIG. 1 is operated to move the cutting means 3 in the +Y direction by the index size stored in the storage means 81, so that the Y position of the cutting blade 32 coincides with the Y position of the line LX3. In this condition, the front side W1 of the wafer W is cut along the line LX3 by the cutting blade 32 in a similar manner to form a cut groove 33 along the line LX3. As illustrated in FIG. 3B, the metal patterns 17 are also formed on the line LX3. Accordingly, the kerf check is not performed for the line LX3.

Thereafter, the chuck table 2 is moved in the +X direction to the original position and the Y moving means 5 illustrated in FIG. 1 is operated to move the cutting means 3 in the +Y direction by the index size stored in the storage means 81, so that the Y position of the cutting blade 32 coincides with the Y position of the line LX4. In this condition, the front side W1 of the wafer W is cut along the line LX4 by the cutting blade 32 in a similar manner to form a cut groove 33 along the line LX4.

(4) Cut Position Measuring Step

In this step, the kerf check is performed at any position other than the positions where the metal patterns 17 and 18 are formed, according to the information on the intervals and positions of the metal patterns 17 and 18 previously stored in the metal pattern position storing step. More specifically, the kerf check is performed for the cut groove 33 formed along the line LX4.

Figure 8:
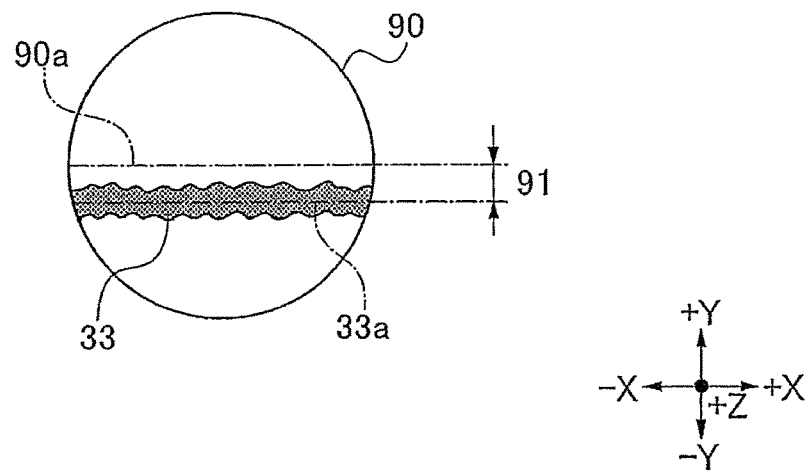
FIG. 8 is a plan view illustrating the positional relation between the cut groove formed on the wafer and a reference line set in imaging means.

After cutting the front side W1 of the wafer W along the line LX4, the supply of the cutting fluid from the cutting fluid nozzles 34 is stopped and the imaging means 90 is next moved to the kerf check position XS on the line LX4. At this kerf check position XS, the imaging means 90 images the area including the cut groove 33. When the reference line 90a of the imaging means 90 coincides with the center line of the cut groove 33, the control means 80 determines that the cut groove 33 is formed at a preset cutting position on the line LX4. Conversely, when there is a deviation 91 between the reference line 90a of the imaging means 90 and the center line 33a of the cut groove 33 as illustrated in FIG. 8, the control means 80 determines in the following manner. In the case that the deviation 91 is less than a predetermined threshold, the control means 80 determines that the cut groove 33 is formed at the preset cutting position. This threshold is previously stored in the storage means 81. On the other hand, in the case that the deviation 91 is not less than the threshold, the control means 80 determines that the deviation 91 is not allowable and the cut groove 33 is not formed at the preset cutting position (desired position) on the line LX4. In this manner, the control means 80 measures the positional relation between the position of the cut groove 33 and the preset cutting position to thereby determine whether or not the cut groove 33 is formed at a desired position.

In the example illustrated in FIG. 8, the center line 33a of the cut groove 33 is deviated from the reference line 90a in the −Y direction. Accordingly, when the control means 80 determines that the deviation 91 is not less than the threshold, the control means 80 immediately operates the motor 52 of the Y moving means 5 illustrated in FIG. 1 just after cutting the line LX4, thereby shifting the cutting means 3 in the +Y direction by the deviation 91 to correct the Y position of the cutting blade 32. As a result, the reference line 90a is brought into coincidence with the center line 33a of the cut groove 33 to be formed along the next line LX4. Accordingly, the center of the line LX5 can be cut by the cutting blade 32 in the next cutting operation.

In the case that the chuck table 2 is movable in the Y direction, the Y position of the chuck table 2 may be shifted without moving the cutting means 3. Also in this case, the position of the cut groove to be formed may be corrected.

In this manner, the cut groove 33 is imaged and if the position of the cut groove 33 is deviated from a desired position, correction can be made so that the cut groove 33 is to be formed at the desired position. Accordingly, in the following cutting operation, the cut groove 33 can be formed at the desired position. Furthermore, in the metal pattern position storing step, the positions where the metal patterns 17 and 18 are formed are stored into the storage means 81. In the cut position measuring step, the cut groove formed at the position where the metal patterns 17 and 18 are not formed is subjected to kerf check as referring to the information stored in the storage means 81. Accordingly, the kerf check can be performed without being influenced by the burrs produced from the metal patterns in cutting the wafer, so that the wafer can be cut with high accuracy.

While the front side W1 of the wafer W is cut to form the cut groove 33 having a predetermined depth not reaching the back side of the wafer in this preferred embodiment, the depth of the cut groove 33 may reach the back side of the wafer W.

The cutting apparatus applicable in the present invention also includes a type such that two cutting means each having a cutting blade are provided and two imaging means are provided near the two cutting means, wherein the cutting blades of the two cutting means are applied to any two lines on the wafer to simultaneously form two cut grooves along the two lines. In the case of using this type of cutting apparatus, the two cut grooves formed are imaged by the two imaging means, and the positional relation between the position of each cut groove and a desired cutting position is separately determined. Further, the position of each cutting means is separately adjusted according to the positional relation determined above, thereby allowing each cutting blade to cut the wafer at the desired position.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer by using a cutting apparatus including cutting means having a cutting blade, said wafer including a substrate and a plurality of devices formed on a front side of said substrate in a plurality of separate regions defined by a plurality of crossing division lines, said wafer further including a plurality of metal patterns for testing arranged on part of said division lines at given intervals, said wafer processing method comprising:

a metal pattern position storing step of storing information on the intervals and positions of said metal patterns into storage means included in said cutting apparatus;

an alignment step of detecting said division lines of said wafer by using alignment means included in said cutting apparatus after performing said metal pattern position storing step;

a cut groove forming step of forming a cut groove along each division line by using said cutting blade of said cutting means after performing said alignment step; and a cut position measuring step of imaging an area including said cut groove at any position where said metal patterns are not formed, by using imaging means included in said cutting apparatus, according to said information on the intervals and positions of said metal patterns previously stored in said metal pattern position storing step, during performing said cut groove forming step, and next measuring the positional relation between the position of said cut groove and a preset cutting position.

* * * * *